United States Patent [15] 3,681,615
Ricci et al. [45] Aug. 1, 1972

[54] SPLIT OUTPUT CIRCUIT FOR A LOGIC GATE

[72] Inventors: Vincent C. Ricci, Upper Darby; William F. Simon, Ambler, both of Pa.

[73] Assignee: Sperry Rand Corporation, New York, N.Y.

[22] Filed: Aug. 9, 1971

[21] Appl. No.: 170,351

Related U.S. Application Data

[63] Continuation of Ser. No. 868,432, Oct. 22, 1969, abandoned.

[52] U.S. Cl. ..................................307/214, 307/215
[51] Int. Cl. ........................H03k 19/34, H03k 19/40
[58] Field of Search......307/213, 214, 203, 215, 246, 307/207, 303

[56] References Cited

UNITED STATES PATENTS 3,229,119 1/1966 Bohn et al.................307/213 X
3,522,444 8/1970 Lourie......................307/213 X

*Primary Examiner*—James W. Lawrence
*Assistant Examiner*—T. N. Grigsby
*Attorney*—Charles C. English, Frank J. Vinci, Jr. and William E. Cleaver

[57] ABSTRACT

A transistor-transistor-logic circuit includes an input stage transistor, a phase-splitter element, a grounded emitter element, and an active pull-up circuit, wherein the active pull-up and grounded emitter stage outputs are split to allow wire OR-ing by tying together either the emitters of like outputs of active pull-up elements, or the collectors of grounded emitter elements, or both, or normal operation by tying together emitters and collectors.

3 Claims, 6 Drawing Figures

INVENTORS
VINCENT C. RICCI
WILLIAM F. SIMON

BY Frank J. Vinci Jr.
AGENT

NEGATIVE OR GATE

POSITIVE OR GATE

SPLIT OUTPUT CIRCUIT FOR A LOGIC GATE

This application is a continuation of Ser. No. 868,432, filed Oct. 22, 1969, now abandoned.

BACKGROUND OF THE INVENTION

This invention relates to logic circuits and more particularly to the class of such circuits commonly referred to as transistor-transistor-logic (TTL) circuits.

Transistor-transistor-logic (TTL) circuits are well known in the art. They generally comprise a transistor driven output stage or stages and one or more transistor input stages, in contradistinction to DTL circuits which have a diode input and transistor output. One type of TTL circuit commonly utilized to drive binary signals into a large distributed load is a TTL integrated logic gate which has its output at the common connection of a grounded emitter element and an active pull-up element. The grounded emitter element is driven from the emitter connection of the phase-splitter element while the active pull-up element is driven from the collector connection of the phase-splitter element. The voltage at the collector connection of the phase-splitter is most positive when the voltage at its emitter connection is most negative, and this state of the element also corresponds to the condition of minimum current through the phase-splitter element. Any increase of current in this element causes its emitter voltage to become more positive and simultaneously causes its collector voltage to become more negative. The generation of voltage transients of opposite polarities by common current transients gives the element its name. When the emitter connection of the phase-splitter element becomes sufficiently positive, the grounded emitter element will conduct very heavily producing a high current pulse to rapidly discharge the distributed load capacity. None of the current is wasted in the driving circuit because the alternate path from the output terminal of the circuit to the power supply terminal through the active pull-up circuit has been simultaneously disconnected by the negative voltage at the collector connection of the phase-splitter element.

The active pull-up may typically embody a pair of transistors connected so that the emitter circuit of the first transistor drives the base circuit of the second transistor, and the emitter circuit of the second transistor drives the output terminal. Because a common maintenance procedure involves grounding the output terminal, the collector of the second transistor is connected to the power supply terminal through a current limiting resistor.

While such a TTL circuit is well known and has many advantages, it is desirous to increase the flexibility and versatility of such circuits. By way of example, the aforementioned TTL circuit cannot be utilized for wired OR-ing for reasons that will become apparent hereinafter. Therefore it is a primary object of the invention to increase the flexibility and versatility of the class of TTL circuits that have an active pull-up and grounded emitter.

It is another object of the invention to provide such a TTL circuit that is easily adaptable to wired OR-ing.

It is a further object of the invention to provide a single such TTL circuit that can be used for either a positive OR gate, a negative OR gate, or both a positive OR gate and a negative OR gate at the same time.

SUMMARY OF THE INVENTION

Briefly stated, according to one aspect of our invention, a TTL circuit includes an input stage for accepting a plurality of logic level signals, a phase-splitter transistor having an input coupled to the output of the input stage and being collector and emitter loaded, its collector being coupled to the input of an active pull-up circuit and its emitter being coupled to the base of a grounded emitter transistor. The emitter output of the active pull-up circuit and the collector output of the grounded emitter circuit are split to provide plural outputs. According to a salient feature, wire OR-ing may be achieved either by tying together the emitters of like outputs of the active pull-up elements, or by tying together the collectors of like outputs of the grounded emitter elements, or both may be so tied together while remaining isolated from unlike outputs.

Improved flexibility and versatility also allow other logic circuits to be provided with fewer elements than has previously been possible.

THE DRAWINGS

Other features and advantages of our invention will be further described and illustrated in conjunction with the accompanying drawings in which like reference numerals identify like components, and in which.

DETAILED DESCRIPTION OF THE INVENTION

Figure 1:
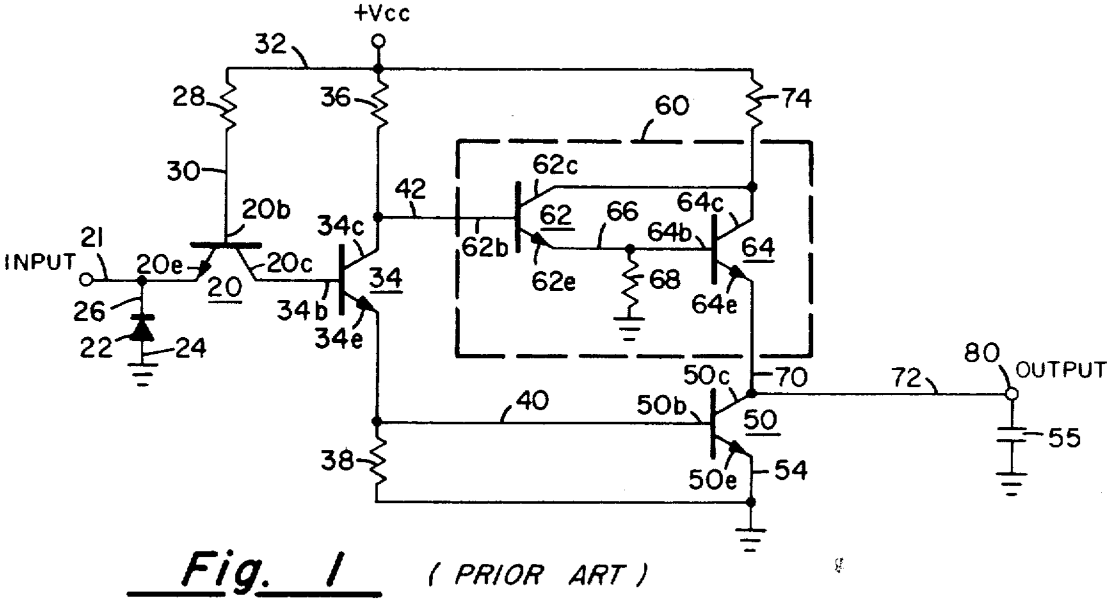
Fig. 1 (PRIOR ART)
FIG. 1 illustrates a prior art TTL circuit having an active pull-up stage and a grounded emitter stage.

Referring now to the drawings, in FIGURE 1 there is shown a prior art TTL circuit employing a grounded emitter stage 50 and an active pull-up stage 60. Also shown is an input stage which includes an input transistor 20 having a base **20*b*, a collector 20*c*, and an emitter 20*e*. Emitter 20*e* is connected to an input conductor 21 which terminates at an input terminal. Diode clamping is provided by the diode 22 which has its anode connected to a reference or ground potential by means of conductor 24, and its cathode connected to emitter 20*e* by means of conductors 26 and 21. A biasing resistor 28 has one end connected to base 20*b* through conductor 30 and the other end connected to a power supply voltage Vcc by means of conductor 32. Such an input circuit operates in a well known manner to provide conduction across the base 20*b* to emitter 20*e* junction when the input signal is at a low voltage level. In response to such a low level voltage input signal, current will flow from source potential Vcc through resistor 28. When the input signal is at a high positive voltage level, the base 29*b* to emitter 20*e*** junction will be reverse biased and will not conduct.

Also shown in FIG. 1 is a phase-splitter which includes transistor 34. Transistor 34 is collector loaded through resistor 36 to source potential Vcc and is emitter loaded through resistor 38 to ground, and provides simultaneous driving of the grounded emitter stage 50 and the active pull-up stage 60. Its emitter 34e is connected by means of conductor 40 to base 50b of grounded emitter transistor 50, and its collector 34c is connected by means of conductor 42 to the input of active pull-up circuit 60. The active pull-up circuit 60 typically utilizes a pair of transistors, such as the transistors 62 and 64, which are connected so that the base 62b is connected to conductor 42 at the input, and so that emitter 62e drives base 64b by means of conductor 66. A biasing resistor 68 has one end connected to conductor 66 and the other end connected to ground. The emitter circuit 64e drives the output terminal 80 by a path through conductors 70 and 72 and is also connected to collector 50c of the grounded emitter stage 50. Because a common maintenance procedure involves the grounding of output terminal 80, the collector 64c of transistor 64 is connected to power supply voltage Vcc through a current limiting resistor 74.

In operation, the TTL circuit of FIGURE 1 utilizes the grounded emitter stage 50 (which has the emitter 50e coupled to ground potential by means of conductor 54) as the principal gain producing part of the circuit. In response to a (positive) high level voltage input signal over input conductor 21, input transistor 20 does not conduct, but the phase-splitter transistor 34 conducts and drives transistor 50 into conduction by supplying a driving current over conductor 40. Then the output over conductor 72 and terminal 80 is switched from the voltage level nearest the course potential Vcc to the level nearest ground potential and the grounded emitter element 50 conducts and rapidly discharges the distributed capacity of a load, such as the capacity represented by numeral 55. When the grounded emitter element 50 conducts, the active pull-up circuit 60 cannot conduct and is off. This is so because phase-splitter transistor 34 is essentially a short circuit when the input voltage is at a high level, and hence current is drawn though resistor 36 into collector 34c, and transistor 62 (and hence transistor 64) do not conduct. However, when the input signal over conductor 21 is switched to a low voltage level, emitter 20e is drawn to a potential close to ground, and current is drawn from source potential Vcc through resistor 28 and across the base 20b to emitter 20e junction. Then, transistor 34 will be an open circuit, and current will also flow from source potential Vcc through resistor 36 and conductor 42 to drive the first transistor 62 of the active pull-up stage 60 into conduction. As transistor 62 is so turned on, it will drive second transistor 64 of active pull-up stage 60 into conduction, and a high level output voltage is generated over conductor 72 and output terminal 80. When the active pull-up circuit 60 conducts, the grounded emitter element 50 cannot conduct, since the transistor 34 prevents the base 50b to emitter 50e junction from being sufficiently biased for conduction.

Figure 2:
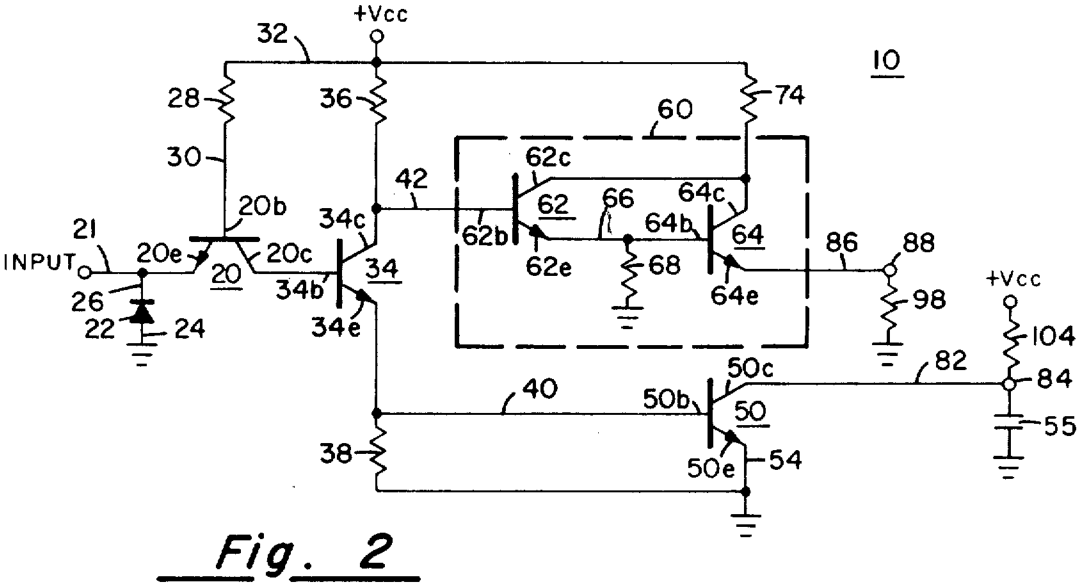
FIG. 2 is a schematic diagram of a TTL circuit embodying the present invention.

Turning now to FIGURE 2, there is shown an improved TTL circuit 10 of the present invention. As shown therein, the TTL circuit 10 includes an input transistor stage 20, a phase-splitter transistor stage 34, an active pull-up stage 60 having a first transistor 62 and a second transistor 64, and a grounded emitter stage 50. According to a salient feature of our invention, the active pull-up stage 60 is split or separated from the grounded emitter stage 50 at the outputs thereof by providing a first output over conductor 82 and terminal 84 which are electrically connected to collector 50c of the grounded emitter stage 50, and a second output over conductor 86 and terminal 88 which are electrically connected to emitter 64e of the active pull-up stage transistor 64. When a high level voltage input signal is applied over input conductor 21, input stage transistor 20 does not conduct, and phase-splitter transistor 34 conducts as described hereinbefore. Then, grounded emitter element 50 conducts heavily producing a low voltage output and drawing high current from source Vcc through load resistance 104 over conductor 82. Since transistors 62 and 64 do not then conduct the output of the active pull-up stage over conductor 86 is substantially at a low voltage level. When a low level voltage signal is applied over input conductor 21, input stage transistor 20 conducts through resistor 28, and phase-splitter transistor 34 is an open circuit. Then, the active pull-up stage 60 conducts as current is drawn across resistor 36 into base 62b, and emitter 62e drives transistor 64 into conduction. Hence, the output over conductor 86 is at a high voltage and a high current flows through emitter 64e to drive a line termination resistor 98 while the output of the grounded emitter stage 50 over conductor 82 is at a high voltage level and its current level is essentially zero. It should be recognized that load resistance 104, line termination resistor 98 and the distributed capacitance represented by numeral 55 only represent schematically the loads driven by the TTL circuit, and that the actual load may be one or more logic circuits as well as other types of circuits.

Figure 3:
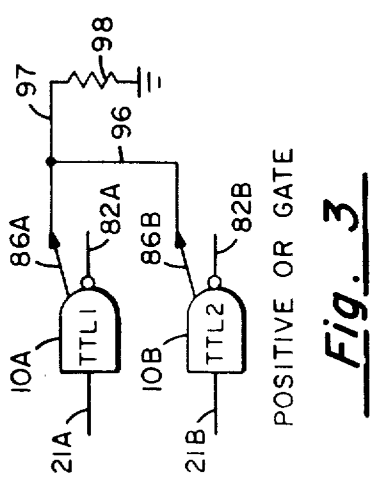
FIG. 3 shows a wired positive OR gate formed from a pair of TTL circuits of FIG. 2.
Figure 6:
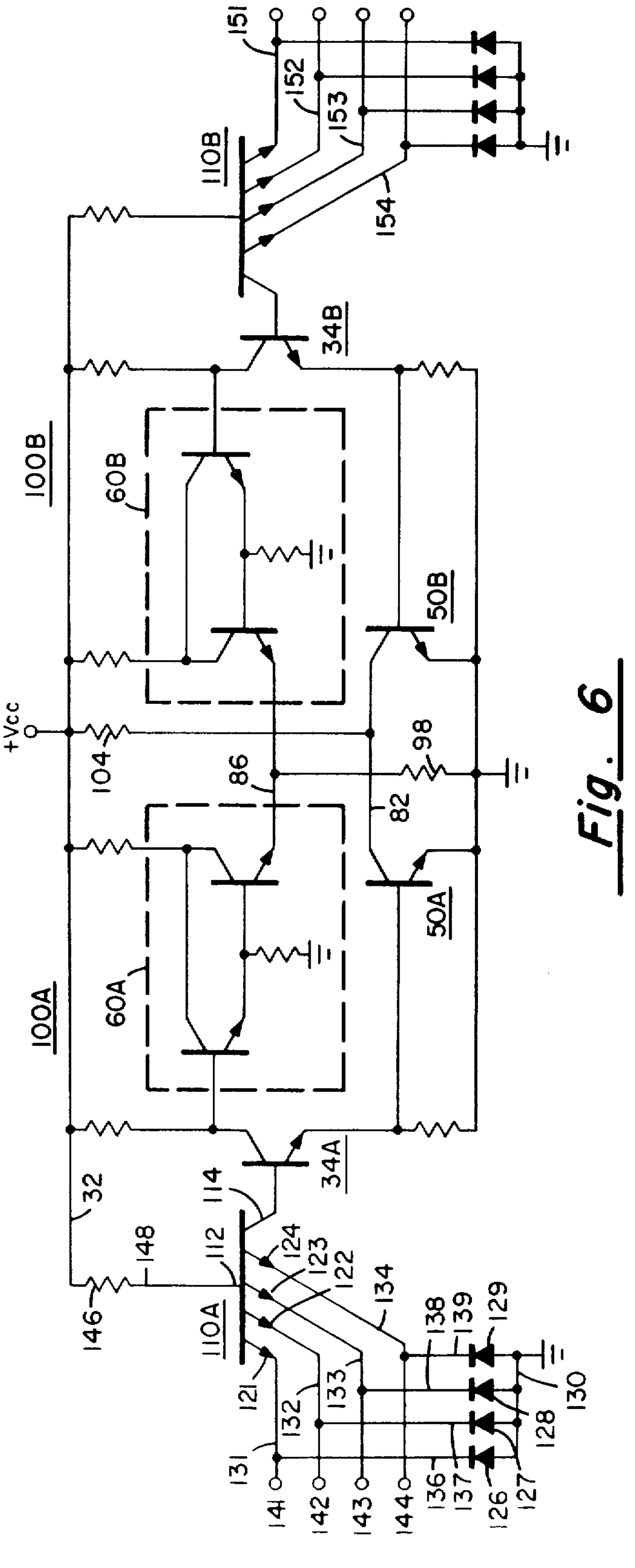
FIG. 6 shows a TTL circuit having split outputs and a plurality of inputs.

The efficacy and utility of the split output TTL circuit 10 of FIGURE 2 may be seen by reference to FIGURES 3 and 6 in the drawings. Referring in particular to FIGURE 3 there is shown a first TTL circuit 10A and a second TTL circuit 10B connected to form a positive OR gate. According to our invention the active pull-up outputs over conductors 86A and 86B form a positive OR gate when they are wired or connected together by conductors 96 and 97 to drive a line termination resistor 98. Hence, the output voltage across termination resistor 98 will be at a high voltage level if either of the inputs to respective input conductors 21A or 21B is at a low voltage level, and will be at a low voltage level only if both of the input voltages to conductors 21A and 21B are at a high voltage level. This is so because a low voltage level input signal causes conduction of an active pull-up stage and results in conduction from Vcc, the source potential, through the active pull-up output transistor 64 and through the termination resistor 98. When both inputs are at a high level, neither active pull-up stage conducts and no voltage is impressed across resistor 98.

Figure 5:
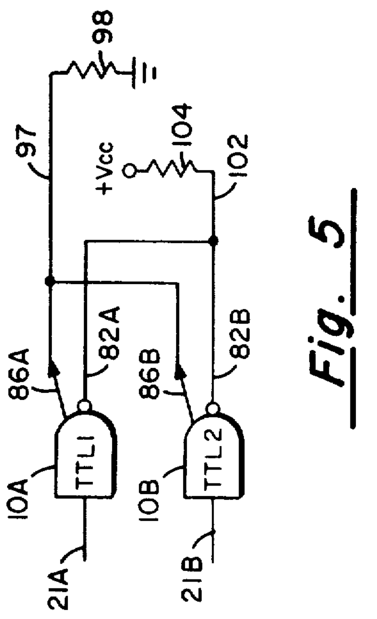
FIG. 5 depicts both a wired positive OR gate and a wired negative OR gate formed from a pair of TTL circuits of FIG. 2.
Figure 4:
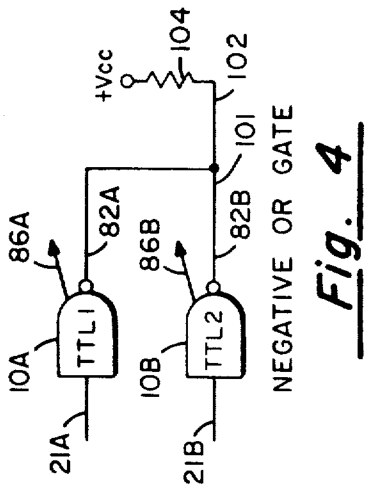
FIG. 4 illustrates a wired negative OR gate formed from a pair of TTL circuits of FIG. 2.

The flexibility and versatility of the split output TTL circuit 10 may also be illustrated by referring to FIGURES 4 and 5. FIGURE 4 shows a wired negative OR gate comprising a first TTL circuit 10A and a second TTL circuit 10B, having grounded emitter stage outputs over conductors 82A and 82B coupled together by conductors 101 and 102 to drive a load resistance 104 which is also interconnected to source potential Vcc. In such a configuration, when either of the input signals is at a high voltage level, the respective grounded emitter circuit will conduct and draw current from the source potential Vcc through load resistance 104 and into the collector 50c of the conducting grounded emitter stage. When both of the input signals are at a low voltage level, the grounded emitter stage does not conduct and no current is drawn through load resistance 104.

It can also be appreciated that the positive OR gate of FIGURE 3 is also a negative AND gate, since a low level output voltage only occurs when both of the input signals are at a high voltage level (condition for non-conduction of both active pull-up stages), and that the negative OR gate of FIGURE 4 is also a positive AND gate, since a high level output voltage only occurs when both of the input signals are at a low voltage level (condition for non-conduction of both grounded emitter stages).

It should also be appreciated by those skilled in the art that the positive OR gate (negative AND) of FIGURE 3, and the negative OR gate (positive AND) of FIGURE 4 may be wired in the same circuit. Thus, in FIGURE 5, the active pull-up stage outputs of TTL1 and TTL2, over respective conductors 86A and 86B form a positive OR gate when they are wired by conductor 97 to drive line termination resistor 98, and the grounded emitter stage outputs over respective conductors 82A and 82B form a negative OR gate when they are wired by conductor 102 to drive load resistor 104.

It will also be recognized that the wired OR-ing feature provided by the present invention cannot be implemented by the prior art TTL circuit of FIGURE 1. By way of example, if the output over conductor 72 of the FIGURE 1 TTL circuit is wired to a like output of a like TTL circuit, then the emitter 64e of an active pull-up stage 60, when turned on by a low level voltage signal to the input of its TTL circuit, would provide a voltage level sufficient to drive current into the collector 50c of the grounded emitter stage 50 of the other TTL circuit to which it is connected, and no output current would be available to drive a load or termination resistor. Furthermore, if two or more emitters 64e conduct into a grounded emitter stage, then improper operation and probable damage would occur to the circuit.

The split output TTL circuit also readily lends itself to acceptance of a set or plurality of input logic level signals. As shown in FIGURE 6, a pair of TTL circuits generally identified by the numerals 100A and 100B include respective grounded emitter stages 50A and 50B, active pull-up stages 60A and 60B, and phase-splitter transistor stages 34A and 34B similar to the like stages shown in the split output TTL circuit of FIGURE 2. Each of the TTL circuits 100A and 100B includes an input transistor stage 110 having a base, a collector and a plurality of emitters. Thus, stage 110A has a base 112, a collector 114, and a plurality of emitters 121, 122, 123, and 124. Each of the emitters 121–124 is connected to one of the respective input conductors 131 to 134 which in turn terminate at input terminals 141–144. Diode clamping is provided through respective diodes 126 to 129, each of which has its respective anode connected to a reference or ground potential by means of conductor 130. Each cathode is connected to an individual emitter by means of the individual conductors 136–139. Biasing is provided through a biasing resistor 146 having one end connected to base 112 by conductor 148 and the other end connected to source potential Vcc through conductor 32.

The multiple emitters 121–124 of each of the transistors 110 operate in a well known manner to perform an AND function so that when all of the input signals are at a high voltage level, the transistor 110 is off and does not conduct. Hence, each of the TTL circuits 100 operates as hereinbefore described to provide a low level output voltage and a driving current to load resistance 104 by means of conductor 82 (the output of the grounded emitter stage) when either all the inputs to TTL 100A or all the inputs to TTL 100B are at a high voltage level. This is so because when all the inputs to any TTL are at a high level, the input transistor 110 does not conduct, and phase-splitter transistor 34 drives the grounded emitter stage 50 into conduction. Conversely, when any one input to a TTL is at a low voltage level, the input transistor will conduct and the active pull-up stage output over conductor 86 provides a high level voltage and driving current to drive line termination resistor 98. Thus, for the active pull-up output, which drives line termination resistor 98, the output will be high if any input over conductors 131-134 or any input over conductors 151–154 is at a low voltage level, and said output will be low only if all the inputs to both TTL input circuits are at a high voltage level. For the grounded emitter output, which drives load resistor 104, driving current will be supplied to resistor 104 if either all the inputs to input transistor 110A or all the inputs to input transistor 110B are at a high level; driving current will not be supplied to resistor 104 if at least one of the input signals to transistor 110A is at a low level, and at least one of the input signals to transistor 110B is at a low level. Hence, the TTL split output circuit shown in FIGURE 6 is both a positive OR gate, and a negative OR gate, and the multiple emitter connections logically achieve the same function as an 8 input NAND gate. When collector OR-ing is applied, the circuit would logically be equivalent to an AND-OR inverter.

While only certain features of our invention have been fully described and illustrated, it should be apparent that other logic circuits may be constructed from the TTL split output circuit. Any circuit using an active pull-up, including flip-flops, NAND gates, NOR gates, AND-OR inverters, and others may efficaciously use the split output of our invention. What we claim as our invention, and what we desire to secure by Letters Patent is:

What is claimed is:

1. A logic circuit comprising, a phase splitting transistor circuit having base, collector and emitter electrodes, a signal input connection to said base electrode adapted for connection to a bivalued input signal source, separate impedance means connecting the collector and emitter electrodes of said phase splitting transistor to respective reference potentials, a first output transistor circuit including base, emitter and collector electrodes, means connecting the base electrode of said first output transistor circuit to the emitter of said phase splitting transistor circuit, a first load connecting the collector of said first output transistor to a source of reference potential, a second output transistor circuit having base, collector and emitter electrodes, means connecting the base electrode of said second output transistor circuit to the collector electrode of said phase splitting transistor, and a second load connecting the emitter of the second output transistor circuit to a reference potential, all of said transistors being of the type to cause a high current to flow through said first load in response to the application of an input signal of one value to the signal input connection of the phase splitter circuit and through the other load in response to an input signal of a second value to the signal input connection of the phase splitter circuit.

2. A logic network comprising a plurality of logic circuits as set forth in claim 1 wherein said first and second loads are connected in common to the respective first and second output transistors of each of the logic circuits comprising the network.

3. A logic network comprising a plurality of logic circuits as set forth in claim 1 wherein the corresponding output transistors of at least two of said logic circuits are connected to a common load.

* * * * *